(12) United States Patent
Park et al.

(10) Patent No.: US 7,205,183 B2
(45) Date of Patent: Apr. 17, 2007

(54) METHODS OF MANUFACTURING THIN FILM TRANSISTORS USING MASKS TO PROTECT THE CHANNEL REGIONS FROM IMPURITIES WHILE DOPING A SEMICONDUCTOR LAYER TO FORM SOURCE/DRAIN REGIONS

(75) Inventors: Sang-il Park, Suwon (KR); Kyung-jin Yoo, Suwon (KR); Kyu-hwan Choi, Sungnam (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/029,335

(22) Filed: Jan. 6, 2005

(65) Prior Publication Data

US 2005/0116228 A1 Jun. 2, 2005

Related U.S. Application Data

(63) Continuation of application No. 10/166,367, filed on Jun. 11, 2002, now Pat. No. 6,875,644.

(30) Foreign Application Priority Data

Nov. 20, 2001 (KR) ............................... 2001-72465

(51) Int. Cl.
*H01L 21/84* (2006.01)
*H01L 29/786* (2006.01)

(52) U.S. Cl. ......................................... 438/151; 257/66

(58) Field of Classification Search ................. 257/66; 438/151

See application file for complete search history.

(56) References Cited

U.S. PATENT DOCUMENTS

| 5,504,020 A | 4/1996 | Aomori et al. ............. 438/162 |
| 5,543,636 A | 8/1996 | Yamazaki ..................... 257/66 |
| 5,576,229 A | 11/1996 | Murata et al. .............. 438/162 |
| 5,580,800 A | 12/1996 | Zhang et al. ............... 438/585 |
| 5,763,904 A | 6/1998 | Nakajima et al. ............. 257/66 |
| 5,837,568 A * | 11/1998 | Yoneda et al. .............. 438/147 |

(Continued)

FOREIGN PATENT DOCUMENTS

JP    07-058337 A    3/1995

(Continued)

OTHER PUBLICATIONS

Stanley Wolf and Richard N. Tauber, "Silicon Processing for the VLSI Era—vol. 1: Process Technology," Lattice Press, Sunset Beach, California (1986), pp. 407-409, 518-519.*

(Continued)

*Primary Examiner*—Stephen W. Smoot
(74) *Attorney, Agent, or Firm*—Stein, McEwen & Bui, LLP

(57) ABSTRACT

A method of manufacturing a thin film transistor includes forming a semiconductor layer on a substrate; forming a gate insulating layer over the entire surface of the substrate to cover the semiconductor layer; depositing a conductive layer on the gate insulating layer; forming a first photosensitive pattern over the conductive layer; patterning the conductive layer according to the photosensitive pattern to form a gate electrode; and ion-doping an impurity into the semiconductor layer using the photosensitive pattern as a mask to form source and drain regions.

24 Claims, 8 Drawing Sheets

U.S. PATENT DOCUMENTS

| | | | |
|---|---|---|---|
| 6,017,783 A | 1/2000 | Yamazaki et al. | 438/164 |
| 6,051,452 A | 4/2000 | Shigyo et al. | 438/151 |
| 6,143,659 A * | 11/2000 | Leem | 438/688 |
| 6,174,757 B1 | 1/2001 | Yamaguchi et al. | 438/166 |
| 6,221,701 B1 | 4/2001 | Yamazaki | |
| 6,277,678 B1 | 8/2001 | Lee | 438/151 |
| 6,317,185 B1 * | 11/2001 | Harano et al. | 349/147 |
| 7,046,321 B2 * | 5/2006 | Kikkawa et al. | 349/113 |

FOREIGN PATENT DOCUMENTS

| | | |
|---|---|---|
| JP | 09-160072 A | 6/1997 |
| JP | 2001-274413 A | 10/2001 |
| KR | 0200706 B1 | 3/1999 |

OTHER PUBLICATIONS

U.S. Appl. No. 10/166,367, filed Jun. 11, 2002, Sang-il Park et al.

Office Action from Chinese Patent Office issued Apr. 26, 2004 re: Chinese Patent Application No. 02152723.7.

* cited by examiner

METHODS OF MANUFACTURING THIN FILM TRANSISTORS USING MASKS TO PROTECT THE CHANNEL REGIONS FROM IMPURITIES WHILE DOPING A SEMICONDUCTOR LAYER TO FORM SOURCE/DRAIN REGIONS

CROSS REFERENCE TO RELATED APPLICATIONS

This application is a continuation of U.S. patent application Ser. No. 10/166,367, filed on Jun. 11, 2002, now U.S. Pat. No. 6,875,644, which claims the benefit of Korean Application No. 2001-72465filed on Nov. 20, 2001, in the Korean Intellectual Property Office, the disclosures of which are incorporated herein in their entirety by reference.

BACKGROUND OF THE INVENTION

1. Field of the Invention

The present invention relates to a method of manufacturing a thin film transistor.

2. Description of Related Art

A flat panel display device includes a thin film transistor (TFT). The thin film transistor employs a lightly doped drain (LDD) structure or an off-set structure in order to prevent a leakage current that occurs in an off state thereof. Recently, research to achieve excellent operability of the thin film transistor, for example, by improving electrical characteristics such as a threshold voltage of a channel layer and electron mobility, has been conducted.

FIGS. 1A and 1B are cross-sectional views illustrating a process of manufacturing a conventional CMOS thin film transistor.

Referring to FIG. 1A, a substrate 10 having a first region 10a and a second region 10b is provided. The first region 10a is a region on which a p-type thin film transistor will be formed, and the second region 10b is a region on which an n-type thin film transistor will be formed.

A poly silicon layer is deposited and patterned to form first and second semiconductor layers 11a and 11b on the first and second regions 10a and 10b, respectively. A gate insulating layer 12 is formed over the entire surface of the substrate 10 to cover the first and second semiconductor layers 11a and 11b.

A metal layer 13 is deposited on the gate insulating layer 12. A first photosensitive layer (not shown) having first and second photoresist patterns is formed on the metal layer 13. The first pattern of the first photosensitive layer is formed over the first semiconductor layer 11a, and the second pattern of the first photosensitive layer covers the entire surface of the second region 10b of the substrate 10. The metal layer 13 is patterned according to the first photosensitive layer, so that a first gate electrode 14a is formed over the first semiconductor layer 11a, and the rest of the metal layer 13 covers the entire surface of the second region 10b. The photoresist pattern is then removed.

A p$^+$-type high-density impurity is ion-doped by an ion implanter that employs an ion-shower method to thereby form first high-density source and drain regions 16a and 16b.

However, the ion implanter that employs the ion-shower method has no mass separator which removes non-desired impurities (e.g., hydrogen) except a desired impurity (e.g., a p$^+$-type impurity) from the doped impurity. As a result, the non-desired impurities such as a hydrogen ion can be doped to even the first and second semiconductor layers 11a and 11b.

Subsequently, a second photosensitive layer (not shown) having first and second patterns is formed on the metal layer 13. The first pattern of the second photosensitive layer covers the entire surface of the first region 10a of the substrate 10, and the second pattern of the second photosensitive layer is formed over the second semiconductor layer 11b. The rest of the metal layer 13 covering the entire surface of the second region 10b is patterned according to the second pattern of the second photosensitive layer to thereby form a second gate electrode 14b.

Using the second photosensitive layer as a mask, an n$^-$-type low-density impurity is ion-doped into the second semiconductor layer 11b to form low-density source and drain regions 18a and 18b. The second photosensitive layer is then removed.

A third photosensitive layer having first and second patterns is formed. The first pattern of the third photosensitive layer covers the entire surface of the first region 10a of the substrate 10. The second pattern of the third photosensitive layer has a greater width than the second gate electrode 14b and so surrounds the second gate electrode 14b. Using the third photoresist layer as a mask, an n$^+$-type high-density impurity is ion-doped into the second semiconductor layer 11b to form second high-density source and drain regions 20a and 20b. Consequently, the CMOS thin film transistor having a lightly doped drain (LDD) structure is completed.

However, as described above, the ion implanter that employs the ion-shower method has no mass separator, which removes non-desired impurities except a desired impurity from the doped impurity. Hence, during an ion doping process to form the first high-density source and drain regions 16a and 16b of the PMOS thin film transistor, the non-desired impurities such as hydrogen ions are ion-doped to even channel regions of the first and second semiconductor layers 11a and 11b under the first and second gate electrodes 14a and 14b.

In other words, even though the first gate electrode 14a and the non-patterned metal layer 13 block the p$^+$-type impurity from being ion-doped during an ion doping process to form the first high-density source and drain regions 16a and 16b, the hydrogen ions having a relatively small mass pass through the first gate electrode 14a and the non-patterned metal layer 13 to be ion-doped to even the channel regions of the first and second semiconductors 14a and 14b.

For example, in order to ion-dope a boron (B), a $B_2H_6$ gas is decomposed into $B_x^+$, $B_xH_y^+$, and $H_x^+$. However, since $B_xH_y^+$ and $H_x^+$ including a hydrogen ion is not removed by the ion implanter that employs the ion shower method, $B_xH_y^+$ and $H_x^+$ as well as $B_x^+$ are ion-doped into the first and second semiconductor layers 11a and 11b.

FIG. 2 illustrates a density of a hydrogen ion doped into respective regions of the thin film transistor after an ion-doping process to form the source and drain regions of the PMOS thin film transistor. As can be seen in FIG. 2, the hydrogen ions are doped into even the semiconductor layer.

Even though a small amount of hydrogen ions are ion-doped into the channel region of the semiconductor layer, the doped hydrogen ions affect an interface characteristic between the semiconductor layer and the gate insulating layer, thereby deteriorating electrical characteristics such as a threshold voltage and an electron mobility and a reliability of the resultant thin film transistor.

SUMMARY OF THE INVENTION

Accordingly, it is an object of the present invention to provide a method of manufacturing a CMOS thin film transistor having excellent electrical characteristics and a high reliability.

The foregoing and other objects of the present invention are achieved by providing a method of manufacturing a thin film transistor, comprising: forming a semiconductor layer on a substrate; forming a gate insulating layer over the entire surface of the substrate to cover the semiconductor layer; depositing a conductive layer on the gate insulating layer; forming a first photosensitive pattern over the semiconductor layer; patterning the conductive layer according to the photosensitive pattern to form a gate electrode; and ion-doping an impurity into the semiconductor layer using the photosensitive pattern as a mask to form source and drain regions.

The photosensitive pattern may be made from one of photoresist, acryl, polyimide, and benzocyclobutene.

The method further comprises hard-baking the photosensitive layer at a predetermined temperature before the ion-doping.

The photosensitive layer has a thickness of at least 5,000 Å.

The foregoing and other objects of the present invention may also be achieved by providing a method of manufacturing a thin film transistor, comprising: forming a semiconductor layer on a substrate; forming a gate insulating layer over the entire surface of the substrate to cover the semiconductor layer; depositing a conductive layer on the gate insulating layer; patterning the conductive layer to form a gate electrode, the gate electrode having a density and a thickness sufficient enough to prevent an impurity from passing therethrough; ion-doping an impurity into the semiconductor layer using the photosensitive pattern as a mask to form source and drain regions.

The gate electrode has a thickness of 3,500 Å to 4,500 Å. The gate electrode has a thickness of 3,500 Å to 4,000 Å, and a density of 3.5 g/cm$^3$ to 4.5 g/cm$^3$. The gate electrode is made of Mo, W, or MoW. The gate electrode has a thickness of 4,000 Å to 4,500 Å, and a density of 1.5 g/cm$^3$ to 2.5 g/cm$^3$. The gate electrode is made of Al or AlNd. The gate electrode has one or more layers. The gate electrode comprises at least one of Mo, W, MoW, Al, and AlNd.

The foregoing and other objects of the present invention are achieved by providing a method of manufacturing a thin film transistor, comprising: forming a semiconductor layer on a substrate; forming a gate insulating layer over the entire surface of the substrate to cover the semiconductor layer; depositing a conductive layer on the gate insulating layer; forming a photosensitive pattern on a portion of the conductive layer corresponding to the semiconductor layer; patterning the conductive layer according to the photosensitive pattern to form a gate electrode; removing the photosensitive pattern; forming an impurity shielding layer on the gate electrode; and ion-doping an impurity into the semiconductor layer using the impurity shielding layer as a mask to form source and drain regions.

The impurity shielding layer is made of an insulating layer or a metal layer. The insulating layer includes an oxide layer, a nitride layer and a silicide layer. The metal layer is made of one of Mo, W, MoW, Al, and AlNd. The impurity shielding layer has one or more layers.

The method further comprises: after the ion-doping, removing the impurity shielding layer; forming a second photosensitive pattern having a width greater than the gate electrode, so that the second photosensitive layer surrounds the gate electrode; and ion-doping an impurity into the semiconductor layer using the second photosensitive layer as a mask, thereby forming a lightly doped drain (LDD) region.

The impurity shielding layer has a width greater than the gate electrode so that the second photosensitive layer sourrounds the gate electrode, thereby forming an off-set region.

BRIEF DESCRIPTION OF THE DRAWINGS

These and other objects and advantages of the present invention will become more apparent and more readily appreciated from the following description of the embodiments, taken in conjunction with the accompanying drawings of which.

DETAILED DESCRIPTION OF PREFFERED EMBODIMENTS

Figure 1A:
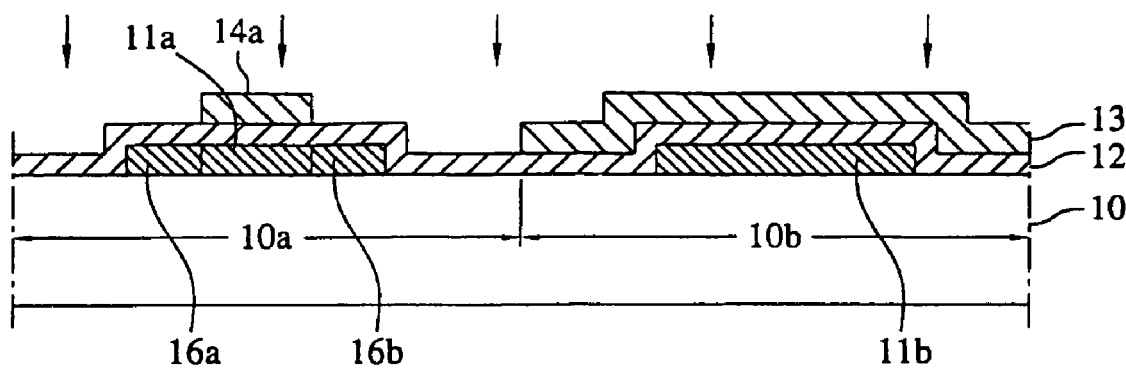
FIGS. 1A and 1B are cross-sectional views illustrating a process of manufacturing a conventional CMOS thin film transistor.
Figure 1B:
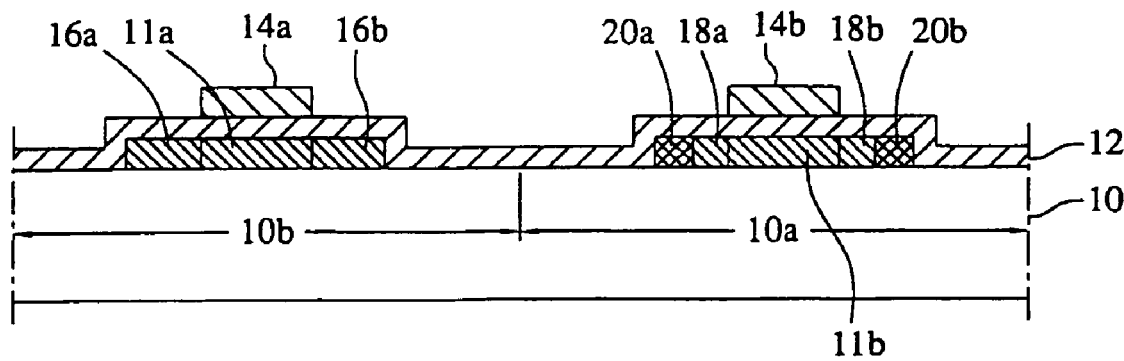
Figure 2:
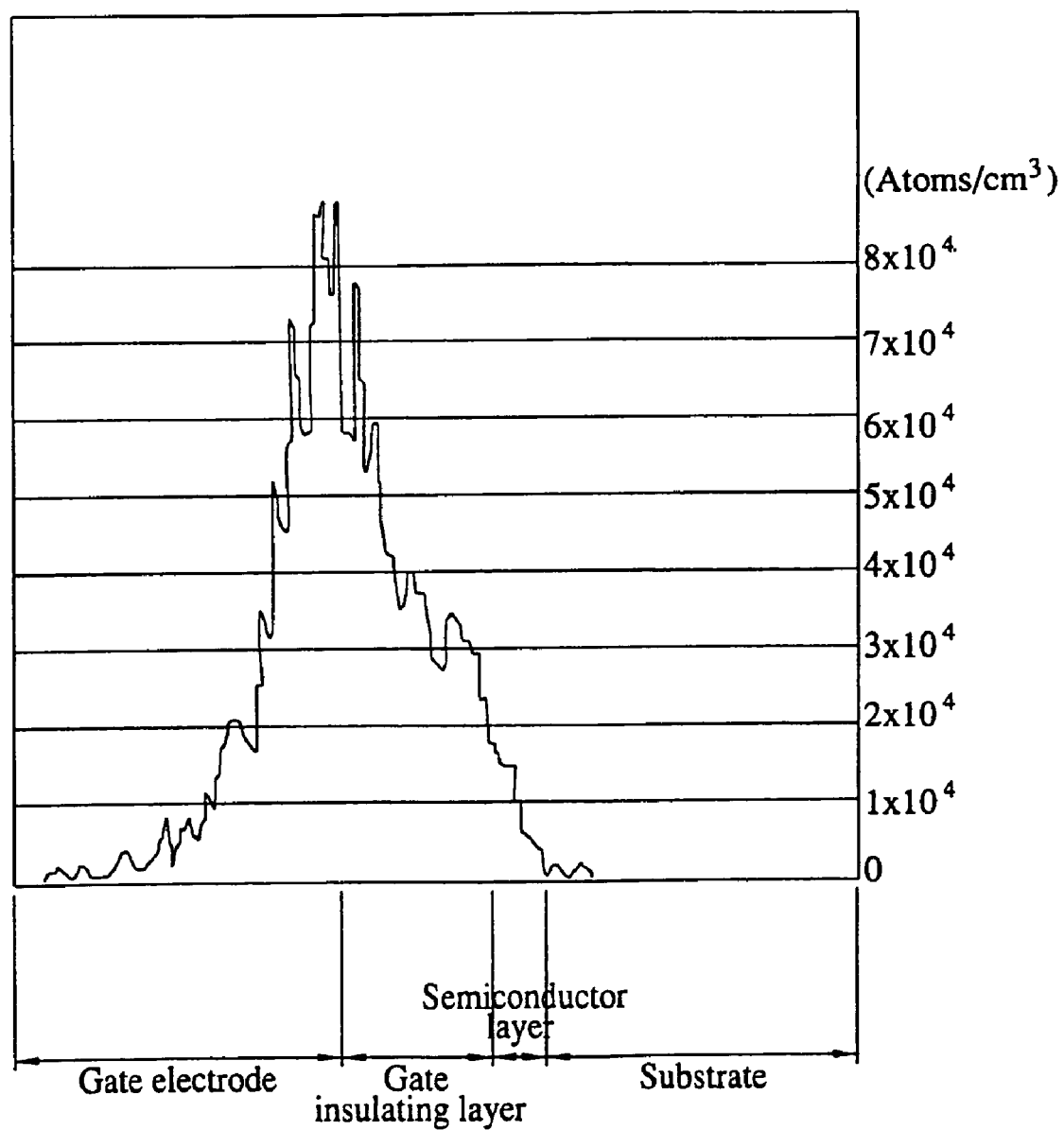
FIG. 2 illustrates a density of a hydrogen ion doped into respective regions of the thin film transistor after an ion-doping process to form the source and drain regions of the conventional CMOS thin film transistor of FIGS. 1A and 1B.

Reference will now be made in detail to the embodiments of the present invention, examples of which are illustrated in the accompanying drawings, wherein like reference numerals refer to like elements throughout.

Hereinafter, a method of manufacturing a thin film transistor according to the present invention is described focusing on a CMOS thin film transistor.

FIGS. 3A to 3G are cross-sectional views illustrating a process of manufacturing a CMOS thin film transistor according to an embodiment of the present invention.

Figure 3A:
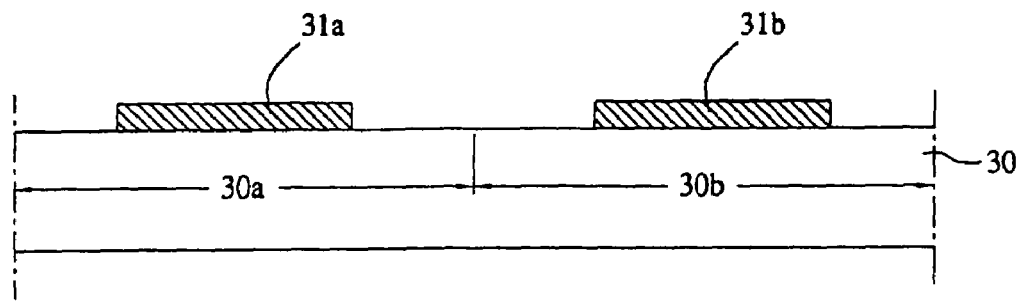
FIGS. 3A to 3G are cross-sectional views illustrating a process of manufacturing a CMOS thin film transistor according to an embodiment of the present invention.

Referring to FIG. 3A, a substrate 30 having a first region 30a and a second region 30b is provided. The first region 30a is a region on which a p-type thin film transistor will be formed, and the second region 30b is a region on which an n-type thin film transistor will be formed.

A poly silicon layer is deposited and patterned to form first and second semiconductor layers 31a and 31b on the first and second regions 30a and 30b, respectively.

Figure 3B:
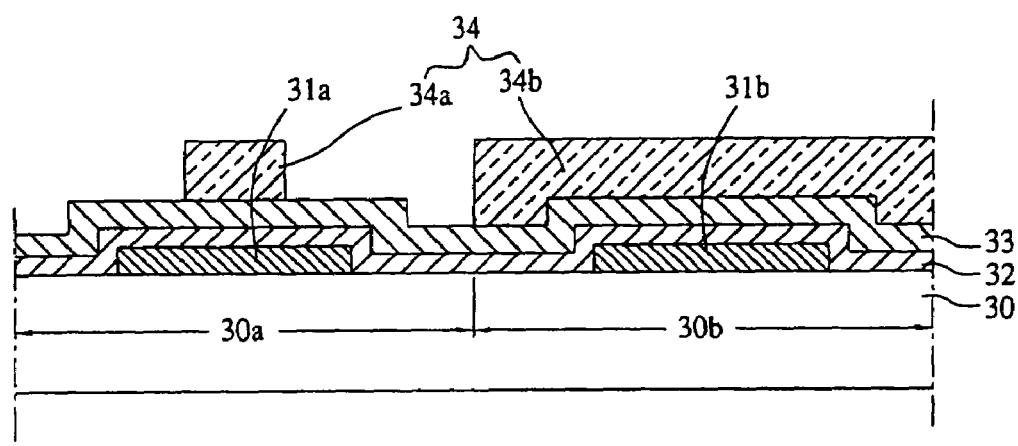

Referring to FIG. 3B, a gate insulating layer 32 comprising an oxide layer is formed over the entire surface of the substrate 30 to cover the first and second semiconductor layers 31a and 31b. A metal layer 33 is deposited on the gate insulating layer 32.

A first photosensitive layer 34 having first and second patterns 34a and 34b is formed to a thickness of at least 5,000 Å on the metal layer 33. The first photosensitive layer 34 is made of one of photoresist, acryl, polyimide, and benzocyclobutene (BCB). The first pattern 34a of the first photosensitive layer 34 is formed over the first semiconductor layer 31a, and the second pattern 34b of the first photosensitive layer 34 covers the entire surface of the second region 30b of the substrate 30.

Thereafter, a hard-baking process is performed at a predetermined temperature in order to remove, for example, water in the early stage, thereby preventing the first photosensitive layer 34 from bursting during a subsequent ion-doping process.

Meanwhile, it is an aspect of the invention that the hard-baking process for the photosensitive layer is performed before the ion-doping process whenever the ion-doping is performed using the photosensitive layer as a mask.

Figure 3C:
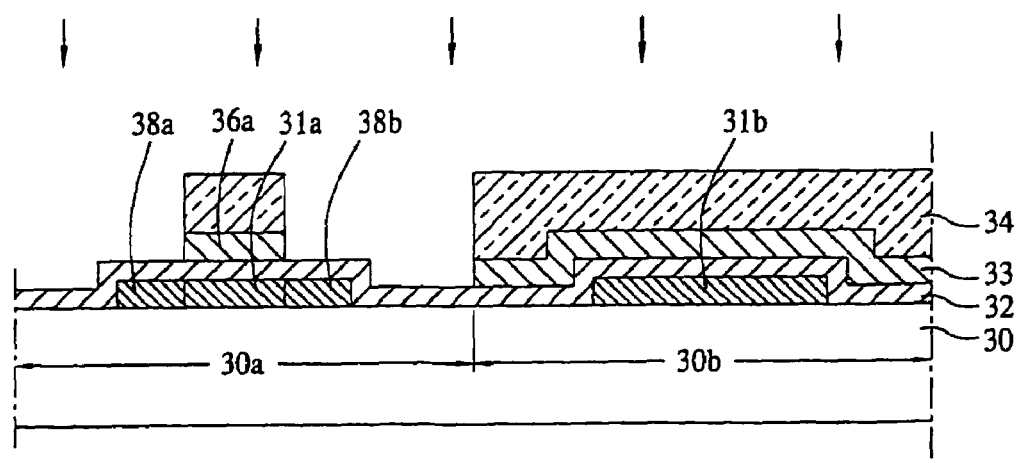

Referring to FIG. 3C, using the first photosensitive layer 34 as a mask, the metal layer 33 is patterned to form a first gate electrode 36a over the first semiconductor layer 31a. The portion of the metal layer 33 under the second pattern 34b of the first photosensitive layer 34 remains without being patterned.

Using the first photosensitive layer 34 as a mask again, a p$^+$-type high-density impurity is ion-doped to thereby form first high-density source and drain regions 38a and 38b. The first photosensitive layer 34 serves to block the hydrogen ions, decomposed by the ion implanter that employs the ion shower method, from being ion-doped into the underlying layers there under. The first photosensitive layer 34 is then removed.

Figure 3D:
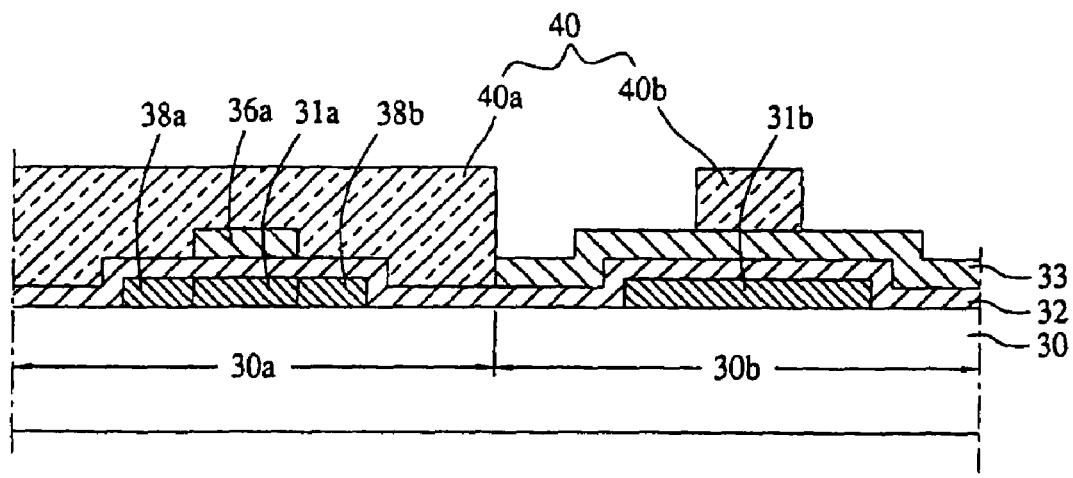

Referring to FIG. 3D, a second photosensitive layer 40 having first and second patterns 40a and 40b is formed on the metal layer 33. The first pattern 40a of the second photosensitive layer 40 covers the entire surface of the first region 30a of the substrate 30, and the second pattern 40b of the second photosensitive layer 40 is formed over the second semiconductor layer 31b.

Figure 3E:
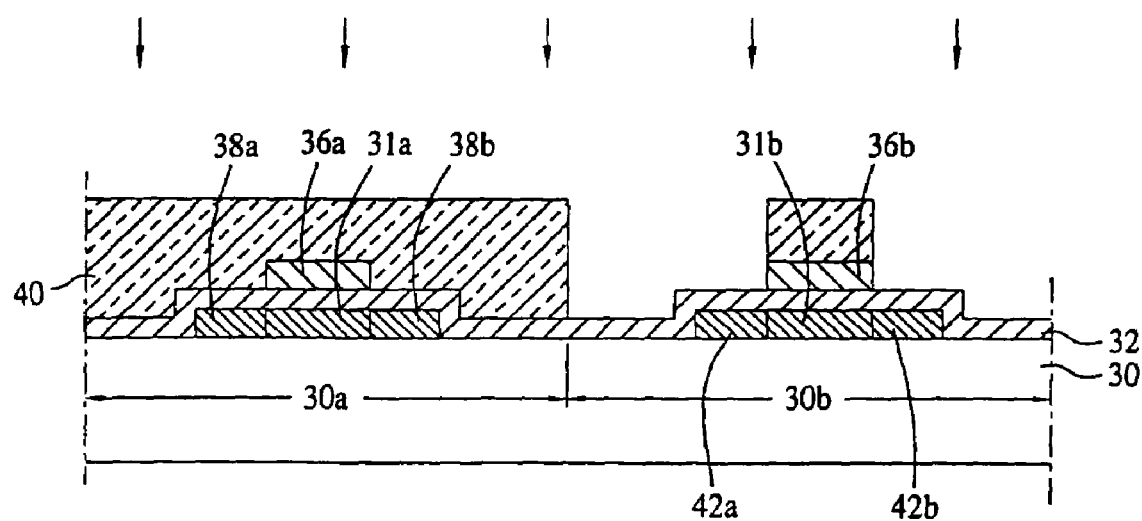

Referring to FIG. 3E, the portion of the metal layer 33 covering the entire surface of the second region 30b is patterned using the second pattern 40b of the second photosensitive layer 40 as a mask to thereby form a second gate electrode 36b.

Using the second photosensitive layer 40 as a mask again, an n$^-$-type low-density impurity is ion-doped into the second semiconductor layer 31b to form low-density source and drain regions 42a and 42b. The second photosensitive layer 40 is then removed.

Figure 3F:
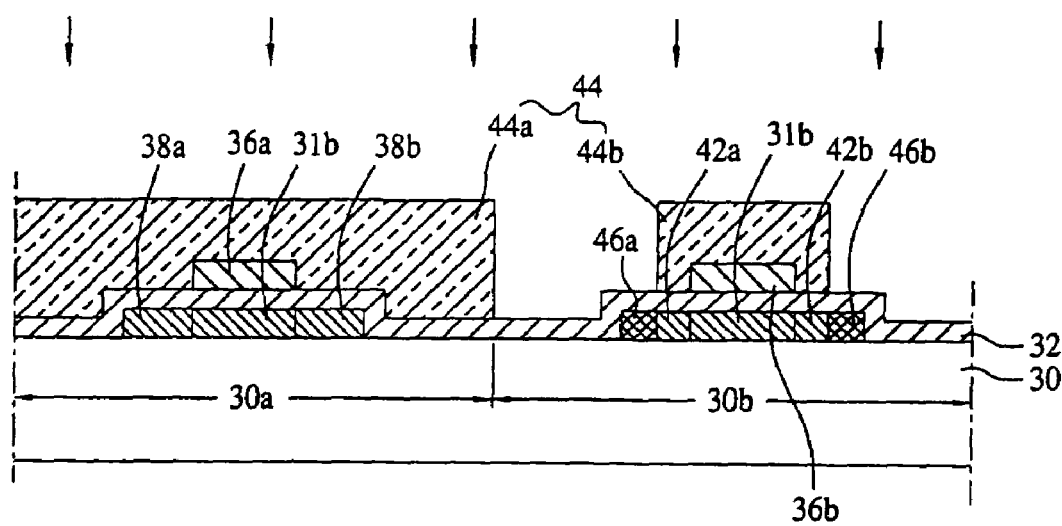

Referring to FIG. 3F, a third photosensitive layer 44 having first and second patterns 44a and 44b is formed. The first pattern 44a of the third photosensitive layer 44 covers the entire surface of the first region 30a of the substrate 30. The second pattern 44b of the third photosensitive layer 44 has a greater width than the second gate electrode 36b to so surround the second gate electrode 36b.

Figure 3G:
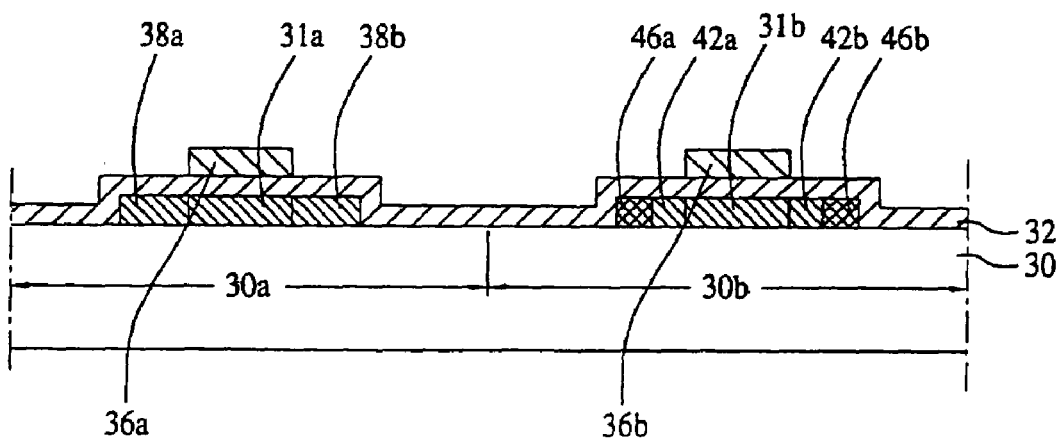

Using the third photoresist layer 44 as a mask, an n$^+$-type high-density impurity is ion-doped into the second semiconductor layer 31b to form second high-density source and drain regions 46a and 46b. The third photosensitive layer 44 is then removed, as illustrated in FIG. 3G. Consequently, the CMOS thin film transistor according to the present invention is completed.

Figure 4:
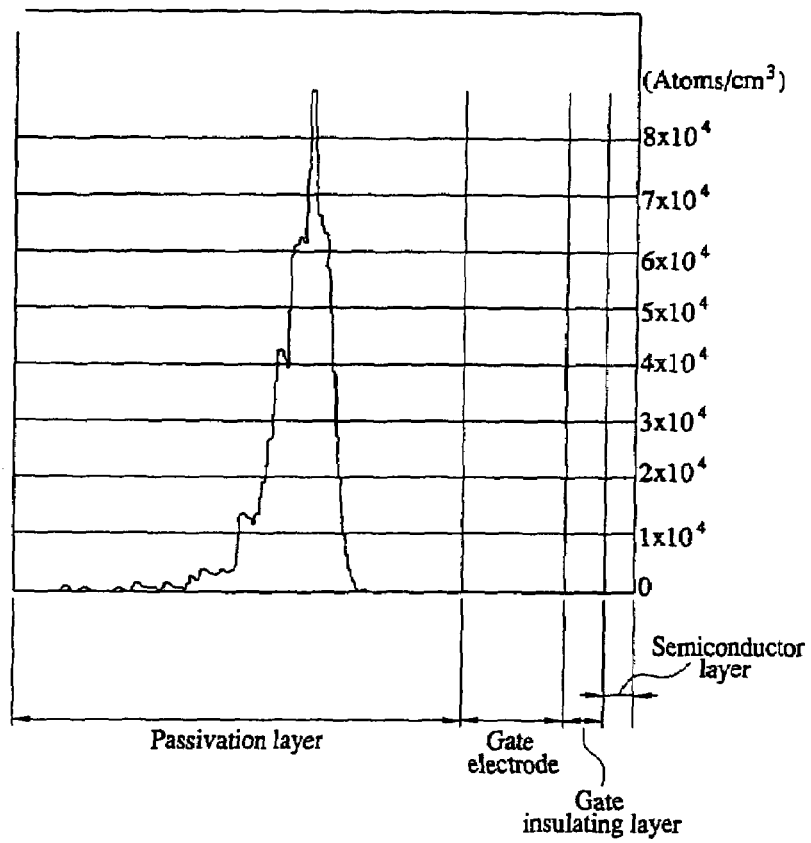
FIG. 4 illustrates a density of a hydrogen ion doped into respective regions of the thin film transistor after an ion-doping process to form the source and drain regions of the CMOS thin film transistor of FIGS. 3A to 3G.

FIG. 4 illustrates a density of a hydrogen ion doped into respective regions of the thin film transistor after an ion-doping process to form the source and drain regions of the CMOS thin film transistor according to the process illustrated in FIGS. 3A through 3G.

As illustrated in FIG. 4, when the impurity is doped, the hydrogen ions cannot be doped into the gate electrode and are therefore only doped into the passivation layer.

Figure 5:
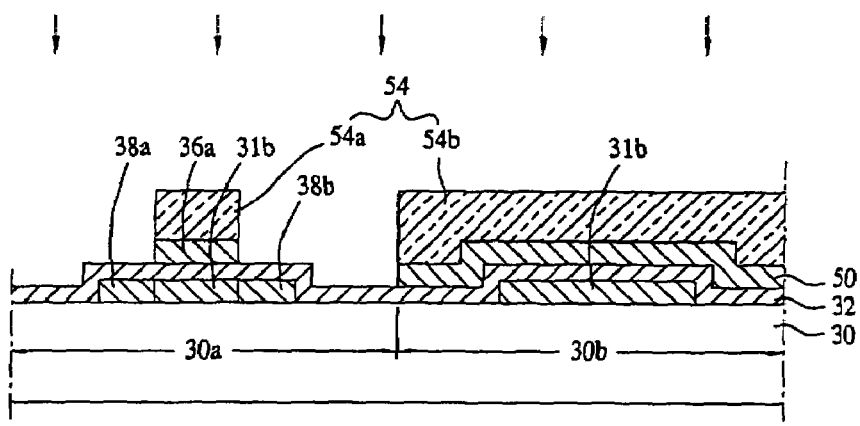
FIG. 5 is a cross-sectional view illustrating a process of manufacturing a CMOS thin film transistor according to another embodiment of the present invention.

FIG. 5 is a cross-sectional view illustrating a process of manufacturing a CMOS thin film transistor according to another embodiment of the present invention.

The method of manufacturing the CMOS thin film transistor according to this embodiment of the present invention is different as far as the process of forming the previous high-density source and drain regions from the first embodiment of the present invention.

After forming the first gate electrode 36a as illustrated in FIG. 3C, the first photosensitive layer 34 is removed. An impurity shielding layer 54 having first and second patterns 54a and 54b is formed.

That is, the first pattern 54a of the impurity shielding layer 54 is formed on the first gate electrode 36a, and the second pattern 54b of the impurity shielding layer 54 is formed on the non-patterned portion of the metal layer 33. The impurity shielding layer 54 is made of an insulating layer such as an oxide layer, a nitride layer, or a silicide layer or, a metal layer such as Mo, W, MoW, Al, or AlNd. In the case of the metal layer, the impurity shielding layer 54 has a single- or multi-layered structure.

Using the impurity shielding layer 54 as a mask, a p$^+$-type high-density impurity is ion-doped to thereby form first high-density source and drain regions 38a and 38b. The impurity shielding layer 54 blocks the hydrogen ions from being ion-doped into the underlying layers thereunder. The impurity shielding layer 54 is then removed.

Subsequent processes are identical to those of FIGS. 3D to 3G.

Figure 6:
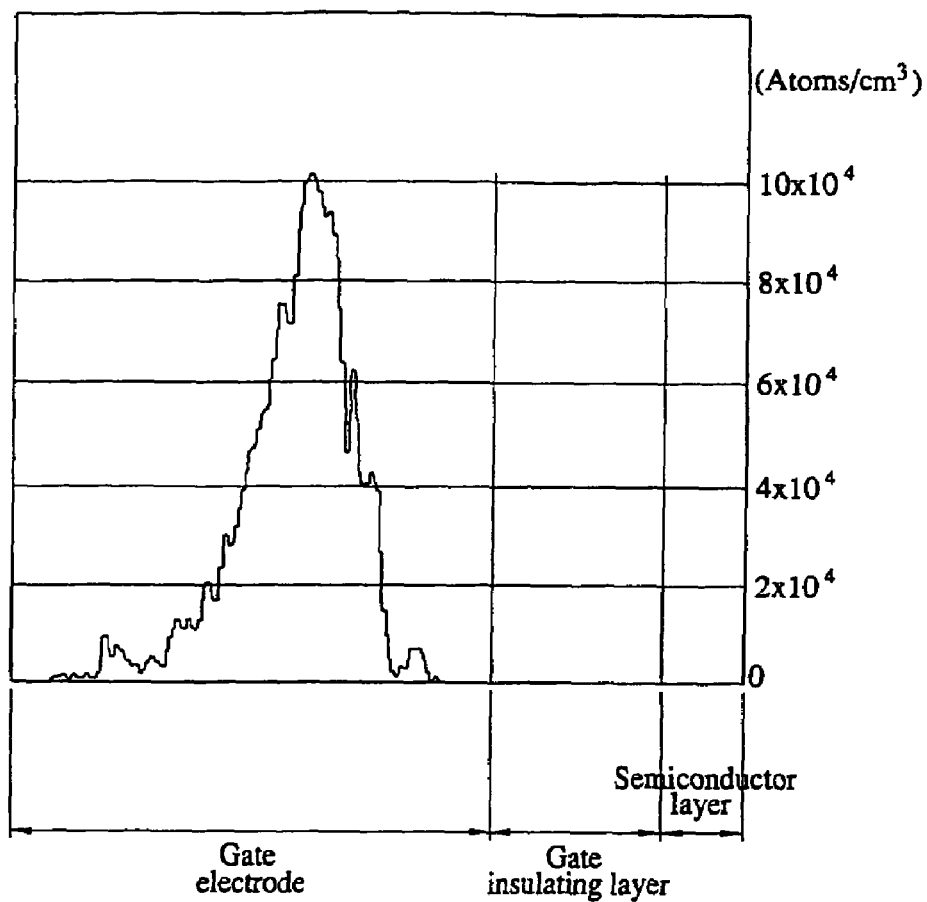
FIG. 6 illustrates a density of a hydrogen ion doped into respective regions of the thin film transistor after an ion-doping process to form the source and drain regions of the CMOS thin film transistor of FIG. 5.

FIG. 6 illustrates a density of hydrogen ions doped into respective regions of the thin film transistor after an ion-doping process to form the source and drain regions of the CMOS thin film transistor according to this embodiment of the present invention.

As illustrated in FIG. 6, the hydrogen ions are doped into the gate electrode, but cannot be doped into the semiconductor layer.

Figure 7:
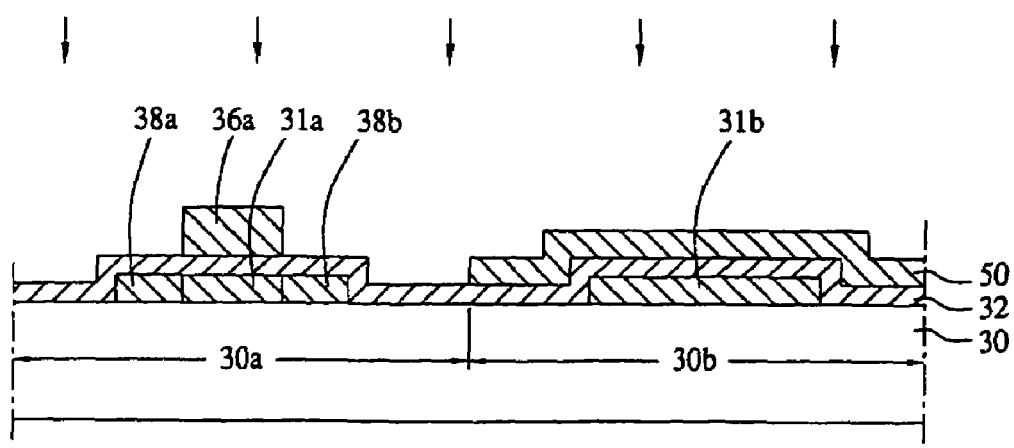
FIG. 7 is a cross-sectional view illustrating a process of manufacturing a CMOS thin film transistor according to yet another embodiment of the present invention.

FIG. 7 is a cross-sectional view illustrating a process of manufacturing a CMOS thin film transistor according to another embodiment of the present invention.

After forming the gate insulating layer 32, a metal layer 50 is deposited over the entire surface of the substrate 30 like the metal layer 33 as illustrated in FIG. 3A. The metal layer 50 has a thickness and a density enough to block the hydrogen ions from being ion-doped into the channel regions of the first and second semiconductor layers 31a and 31b.

Preferably, a thickness of the metal layer 50 is in a range between 3,500 Å to 4,500 Å.

In the case of the metal layer 50 having a thickness of less than 4,000 Å, preferably, the metal layer 50 preferably has a density of 3.5 g/cm$^3$ to 4.5 g/cm$^3$ and is made of a conductive material such as Mo, W, and MoW.

In the case of the metal layer 50 having a thickness of more than 4,000 Å, preferably, the metal layer 50 has a density of 1.5 g/cm$^3$ to 2.5 g/cm$^3$ and is made of a conductive material such as Al and AlNd.

The metal layer 50 has a single- or a multi-layered structure. For example, the metal layer 50 can have a three-layered structure comprising a MoW layer having a thickness of 500 Å, an Al layer having a thickness of 2,000 Å and a MoW layer having a thickness of 500 Å.

Thereafter, the first photosensitive layer 34 having the first and second patterns 34a and 34b is formed on the metal layer 50 like on the metal layer 33 as illustrated in FIG. 3B. Using the first photosensitive layer 34 as a mask, the metal layer 50 is patterned to form the first gate electrode 36a. The first photosensitive layer 34 is then removed.

Using the first gate electrode 36a and the non-patterned portion of the metal layer 50 as a mask, a p$^+$-type high-density impurity is ion-doped to thereby form first high-density source and drain regions 38a and 38b. Since a thickness and a density of the metal layer 50 are adjusted, the hydrogen ions cannot be ion-doped into the channel regions of the first and second semiconductor layers 31a and 31b.

Subsequent processes are identical to those of FIGS. 3D to 3G.

Figure 8:
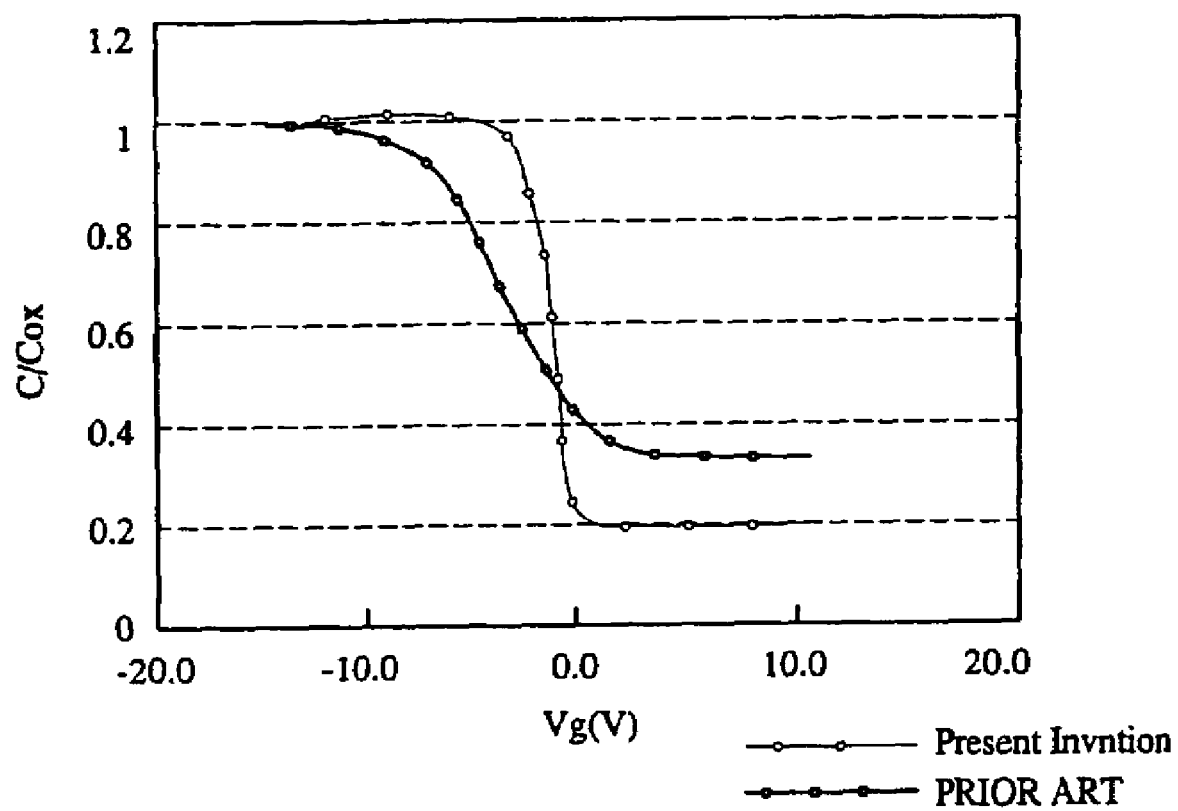
FIG. 8 illustrates a graph of a C-V curve of the CMOS thin film transistors according to the conventional art and the present invention.

FIG. 8 illustrates a graph of a C-V curve of the CMOS thin film transistors according to the conventional art and the present invention. A vertical axis denotes a ratio C/Cox of a capacitance C between the gate electrode and the substrate with respect to a capacitance Cox of the gate insulating layer. A horizontal axis denotes a voltage Vg applied to the gate electrode.

As can be seen in FIG. 8, in the CMOS thin film transistor according to the present invention, the capacitance C drops sharply at the voltage Vg of about 0 volts, so that the ratio C/Cox is shifted from 0.2 to 1. However, in the CMOS thin film transistor according to the conventional art, the capacitance C drops gradually at the voltage Vg of about 0 volts, so that the ratio C/Cox is shifted from 0.4 to 1. This is because in the case of the conventional CMOS thin film transistor the hydrogen ions are ion-doped to an interface between the semiconductor layer and the gate insulating layer, thereby forming trap sites in the semiconductor layer. However, in the case of the inventive CMOS thin film transistor, it is possible to prevent the hydrogen ions from being ion-doped into the interface between the semiconductor layer and the gate insulating layer, thereby preventing a formation of the trap sites in the semiconductor layers.

The present invention has been described focusing on the CMOS thin film transistor. However, the present invention is not limited to the CMOS thin film transistor. For example, the present invention can be applied to a method of manufacturing just one of an NMOS thin film transistor and a PMOS thin film transistor.

As described above, the thin film transistor manufactured according to the present invention has excellent electrical characteristics such as a threshold voltage and an electron mobility, and a high reliability.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of manufacturing a thin film transistor, comprising:
   forming a semiconductor layer on a substrate;
   forming a gate insulating layer over an entire surface of the substrate to cover the semiconductor layer;
   depositing a conductive layer on the gate insulating layer;
   depositing a photoresist layer directly on the conductive layer, then patterning the conductive layer using the photoresist layer deposited directly on the conductive layer to form a gate electrode from a portion of the conductive layer, and then removing the photoresist layer, the gate electrode having a density of 1.5 g/cm$^3$ to 2.5 g/cm$^3$ and a thickness of more than 4,000 Å to prevent an impurity from passing therethrough; and
   ion-doping the impurity into the semiconductor layer using the gate electrode as a mask to form source and drain regions;
   wherein part of the impurity impinges directly on the portion of the conductive layer forming the gate electrode without first impinging on any other layer during the ion-doping of the impurity into the semiconductor layer; and
   wherein the impurity comprises hydrogen.

2. The method according to claim 1, wherein the conductive layer comprises one or more layers, such that the gate electrode formed from the conductive layer comprises one or more layers.

3. The method according to claim 2, wherein the gate electrode comprises Mo, W, MoW, Al, or AlNd, or a combination of two or more thereof.

4. The method according to claim 1, wherein the impurity further comprises p$^+$-type ions.

5. The method according to claim 1, wherein the gate electrode comprises Al or AlNd.

6. The method according to claim 1, wherein the gate electrode has a thickness of 4,000 Å to 4,500 Å.

7. The method according to claim 1, wherein the conductive layer comprises at least a first layer, a second layer, and a third layer, such that the gate electrode formed from the conductive layer comprises at least a portion of the first layer, a portion of the second layer, and a portion of the third layer;
   wherein at least one layer of the first layer, the second layer, and the third layer is made of a first material; and
   wherein at least one other layer of the first layer, the second layer, and the third layer is made of a second material different from the first material.

8. The method according to claim 7, wherein the first layer, the second layer, and the third layer are a first MoW layer, an Al layer, and a second MoW layer.

9. The method according to claim 1, wherein the conductive layer comprises AlNd, such that the gate electrode formed from the conductive layer comprises AlNd.

10. A method of manufacturing a thin film transistor, comprising:
    forming a semiconductor layer on a substrate;
    forming a gate insulating layer over an entire surface of the substrate to cover the semiconductor layer;
    depositing a conductive layer on the gate insulating layer;
    forming a non-desired impurity blocking pattern directly on the conductive layer;
    patterning the conductive layer according to the non-desired impurity blocking pattern to form a gate electrode having a density of 1.5 g/cm$^3$ to 2.5 g/cm$^3$ and a thickness of more than 4,000 Å;
    ion-doping a p$^+$-type impurity into the semiconductor layer using the non-desired impurity blocking pattern as a mask blocking penetration of non-desired impurities to form first source and drain regions; and
    removing the non-desired impurity blocking pattern after the ion-doping of the p$^+$-type impurity into the semiconductor layer;
    wherein the non-desired impurities comprise hydrogen.

11. The method according to claim 10, wherein the gate electrode has a thickness of 4,000 Å to 4,500 Å.

12. The method according to claim 10, wherein the conductive layer comprises at least a first layer, a second layer, and a third layer, such that the gate electrode formed from the conductive layer comprises at least a portion of the first layer, a portion of the second layer, and a portion of the third layer;
   wherein at least one layer of the first layer, the second layer, and the third layer is made of a first material; and
   wherein at least one other layer of the first layer, the second layer, and the third layer is made of a second material different from the first material.

13. The method according to claim 12, wherein the first layer, the second layer, and the third layer are a first MoW layer, an Al layer, and a second MoW layer.

14. The method according to claim 10, wherein the conductive layer comprises AlNd, such that the gate electrode formed from the conductive layer comprises AlNd.

15. A thin film transistor, comprising:
   a semiconductor layer on a substrate;
   a gate insulating layer extending over an entire surface of the substrate to cover the semiconductor layer;
   a conductive layer comprising at least a first layer, a second layer, and a third layer on the gate insulating layer; and
   a gate electrode comprising at least a portion of the first layer, a portion of the second layer, and a portion of the third layer formed by patterning the conductive layer using a photoresist and having a predetermined density and a thickness enough to prevent an impurity from passing therethrough;
   wherein at least one layer of the first layer, the second layer, and the third layer is made of a first material;
   wherein at least one other layer of the first layer, the second layer, and the third layer is made of a second material different from the first material; and
   wherein a hydrogen ion density is constant according to a depth of the semiconductor layer in a channel region of the semiconductor layer.

16. The thin film transistor according to claim 15, wherein the gate electrode has a thickness of at least 3,500 Å.

17. The thin film transistor according to claim 16, wherein the gate electrode has a thickness of 4,000 Å to 4,500 Å, and a density of 1.5 $g/cm^3$ to 2.5 $g/cm^3$.

18. The thin film transistor according to claim 17, wherein the gate electrode comprises Al or AlNd.

19. The thin film transistor according to claim 15, wherein the gate electrode comprises Mo, W, MoW, Al, or AlNd, or a combination of two or more thereof.

20. The thin film transistor according to claim 15, wherein the impurity comprises $p^+$-type ions.

21. The thin film transistor according to claim 15, wherein the first layer, the second layer, and the third layer are a first MoW layer, an Al layer, and a second MoW layer.

22. A thin film transistor, comprising:
   a semiconductor layer on a substrate:
   a gate insulating layer over the entire surface of the substrate to cover the semiconductor layer;
   a conductive layer comprising at least a first layer, a second layer, and a third layer on the gate insulating layer; and
   a gate electrode comprising at least a portion of the first layer, a portion of the second layer, and a portion of the third layer formed by patterning the conductive layer using a photoresist and having a thickness of at least 3,500 Å to 4,000 Å and a density of 3.5 $g/cm^3$ to 4.5 $g/cm^3$;
   wherein a hydrogen ion density is constant according to a depth of the semiconductor layer in a channel region of the semiconductor layer.

23. The thin film transistor according to claim 22, wherein the first layer, the second layer, and the third layer are a first MoW layer, an Al layer, and a second MoW layer.

24. The thin film transistor according to claim 22, wherein at least one layer of the first layer, the second layer, and the third layer is made of a first material; and
   wherein at least one other layer of the first layer, the second layer, and the third layer is made of a second material different from the first material.

* * * * *